(12) United States Patent
Schulz et al.

(10) Patent No.: US 7,981,789 B2
(45) Date of Patent: Jul. 19, 2011

(54) FEATURE PATTERNING METHODS AND STRUCTURES THEREOF

(75) Inventors: Thomas Schulz, Heverlee (BE); Sergei Postnikov, Brussels (BE)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 12/271,606

(22) Filed: Nov. 14, 2008

(65) Prior Publication Data

US 2010/0123250 A1 May 20, 2010

(51) Int. Cl.
*H01L 21/4763* (2006.01)
(52) U.S. Cl. ........... 438/622; 438/669; 257/E21.575; 257/E21.023
(58) Field of Classification Search ............ 438/618, 438/622, 669, 674; 257/E21.575, E21.627, 257/E21.641, E21.023
See application file for complete search history.

(56) References Cited

U.S. PATENT DOCUMENTS

| | | | |
|---|---|---|---|
| 7,709,401 B2 * | 5/2010 | Chen et al. .............. | 438/783 |
| 2007/0172770 A1 | 7/2007 | Witters et al. | |
| 2007/0215986 A1 | 9/2007 | Manger et al. | |
| 2008/0020329 A1 | 1/2008 | Sugimoto | |

OTHER PUBLICATIONS

Wiaux, Vincent, et al., "Split and Design Guidelines for Double Patterning," Optical Microlithography XXI, Proc. of SPIE, 2008, 11 pages, vol. 6924.
Hazelton, Andrew J., "Double Patterning Requirements for Optical Lithography and Prospects for Optical Extension Without Double Patterning," Optical Microlithography XXI, Proc. of SPIE, 2008, 13 pages, vol. 6924.

* cited by examiner

*Primary Examiner* — Hoai v Pham
(74) *Attorney, Agent, or Firm* — Slater & Matsil, L.L.P.

(57) ABSTRACT

Methods of patterning features, methods of manufacturing semiconductor devices, and semiconductor devices are disclosed. In one embodiment, a method of patterning a feature includes forming a first portion of the feature in a first material layer. A second portion of the feature is formed in the first material layer, and a third portion of the feature is formed in a second material layer.

16 Claims, 4 Drawing Sheets

FEATURE PATTERNING METHODS AND STRUCTURES THEREOF

TECHNICAL FIELD

The present invention relates generally to the fabrication of semiconductor devices, and more particularly to patterning features of semiconductor devices and structures thereof.

BACKGROUND

Semiconductor devices are used in a variety of electronic applications, such as personal computers, cell phones, digital cameras, and other electronic equipment, as examples. Semiconductor devices are typically fabricated by sequentially depositing several insulating or dielectric layers, conductive layers, and semiconductive layers of material over a semiconductor substrate, and patterning the various layers using lithography to form circuit components and elements thereon.

There is a trend in the semiconductor industry towards reducing the size of features, e.g., the circuits, elements, conductive lines, vias, and contacts of semiconductor devices, in order to improve the performance of the semiconductor devices, reduce power consumption, and meet smaller packaging requirements, for example. However, as feature sizes of semiconductor devices diminish, the patterning of features becomes more challenging. The transfer of patterns of lithography masks to semiconductor devices having small feature sizes may be inaccurate or unpredictable in some applications, for example.

Double patterning is a process that is used to print small minimum feature sizes of some semiconductor devices. In double patterning, a design for conductive lines is split into two layouts each having a minimum pitch equal to two times the minimum pitch of the original design. Two lithography masks are used to print alternating conductive lines, so that each mask can be imaged with better contrast due to the relaxed pitch. A patterning process flow for double patterning typically includes exposing a first resist film with a first lithography mask, transferring an image of the first mask from the first resist film into a hard mask, and stripping the first resist film. A second resist film is recoated and exposed with a second lithography mask, and the second resist image from the second lithography mask is transferred into the hard mask. The hard mask is then used as an etch mask to pattern a material layer beneath the hard mask.

Double patterning techniques may work well in some applications where the conductive lines are parallel along their entire length. However, double patterning presents problems such as shorts and misalignment in some designs, such as designs having meandering patterns, particularly when optical proximity correction (OPC) is used to improve pattern transfer, because minimum pitch and/or gap sizes can be reintroduced.

Thus, what are needed in the art are improved methods of patterning features of semiconductor devices.

SUMMARY OF THE INVENTION

These and other problems are generally solved or circumvented, and technical advantages are generally achieved, by embodiments of the present invention, which provide novel methods of patterning features, methods of manufacturing semiconductor devices, and semiconductor devices.

In accordance with one embodiment of the present invention, a method of patterning a feature includes forming a first portion of the feature in a first material layer. A second portion of the feature is formed in the first material layer, and a third portion of the feature is formed in a second material layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
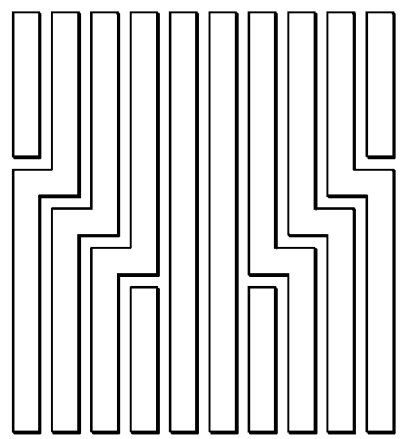
FIG. 1 shows a prior art pattern for conductive lines.

FIG. 1 shows a prior art layout pattern 102 for conductive lines. Some conductive lines in the pattern 102 have meandering portions or turns, as shown. To print the pattern 102 using double patterning techniques, the design polygons or parts of the polygons are assigned to two different layers to be patterned separately using two lithography masks, which is often referred to as a coloring step. FIGS. 2A through 2D show a prior art double patterning technique for the pattern 102 shown in FIG. 1.

Figure 2A:
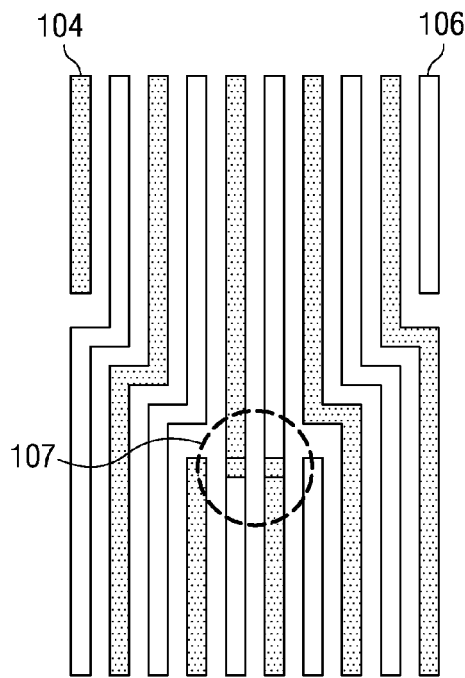
FIGS. 2A through 2D show a prior art double patterning technique for the pattern shown in FIG. 1.

In FIG. 2A, every other conductive line is patterned using a separate lithography mask, for most of the conductive lines. The design split for a minimum pitch is possible only if the patterns are cut or segmented in certain places to avoid coloring conflicts, e.g., the polygonal shaped patterns for a single mask cannot be placed side-by-side at a minimum pitch. The majority of the conductive lines 104 and 106 are patterned in their entirety in the layout shown in FIG. 2A; however, the central straight conductive lines are segmented to avoid coloring conflicts, with a portion of the conductive lines 104/106 being patterned using one mask (portions 104) and another portion being patterned with the other mask (portions 106). Stitching overlaps in the cut region 107 are used to form a single continuous conductive line for the central conductive lines 104/106, as shown. Conductive lines or portions thereof 104 are patterned using a first lithography mask having the pattern shown in FIG. 2B, and conductive lines or portions thereof 106 are patterned using a second lithography mask having the pattern shown in FIG. 2C. The layouts of the lithography masks used to pattern the conductive lines or portions thereof 104 and 106 are shown in phantom in FIGS. 2B and 2C, respectively. The actual pattern formed on the semiconductor device is shown in solid lines in FIGS. 2B and 2C. The actual pattern is different from the design intent because of the optical imaging of the lithography process.

Figure 2B:
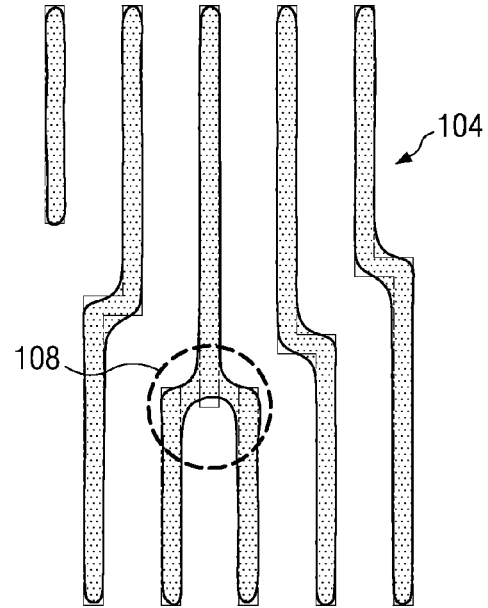
Figure 2C:
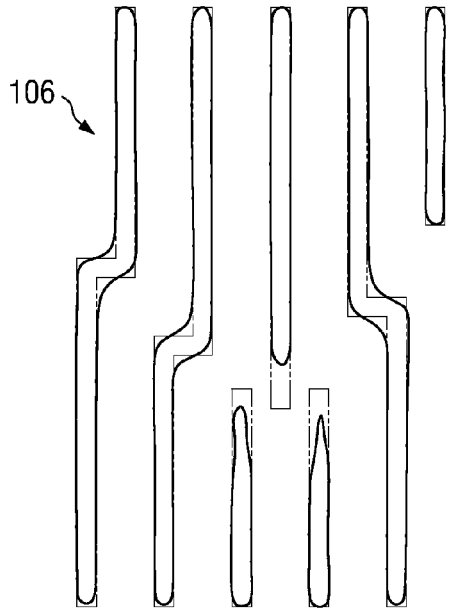
Figure 2D:
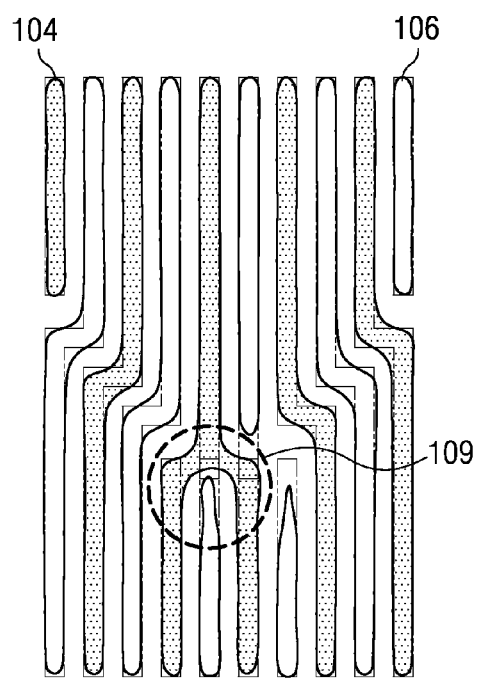

However, a problem with this double patterning technique is that the close proximity of some conductive line patterns to adjacent conductive line patterns causes catastrophic failures of shorted metal lines even at nominal conditions, as shown in region 108 in FIG. 2B. The final image reproduced on the semiconductor device resulting from the combinations of the patterns for conductive lines and portions 104 and 106 is shown in FIG. 2D, with region 109 containing metal line failures due to shorts and stitching failures caused by the double patterning process.

Polygonal shapes of the conductive lines or portions thereof 104 and 106 shown in FIGS. 2A through 2D are difficult to reconstruct with high fidelity due to optical pull-back of the cut line ends and overlay. Thus, the cut regions 107 of the patterns create weak lithography spots that have a high risk of failure during production processes, which lowers the yield and/or circuit reliability of semiconductor devices fabricated using these double patterning processes. Furthermore, the stitching overlaps in the cut regions 107 of the layouts shown in FIGS. 2A through 2D can reintroduce dense pitches.

Other patterns can also cause lithography problems when double patterning techniques are used. Catastrophic failures of shorted metal lines can occur due to process variations, such as dose, focus, and masking in the lithography process when two lithography masks are used to pattern conductive lines. Shorts, patterning defects, and bridging failures can occur in the cut regions 107 of known double patterning techniques. In some designs, if optical proximity correction (OPC) is used to overcome line shortening of the patterns, the patterns may be lengthened, also resulting in shorts of the conductive lines, for example. Some double patterning techniques may cause bridging and/or pinching during exposure, because OPC re-introduces a minimum pitch and/or gap. Relaxing the minimum pitch and gap then becomes necessary, in order to allow for sufficient OPC in the cut regions, to correct for the line-end shortening and overlay error. However, this leads to an increase in the size of the cell area, which is undesirable in many applications.

Embodiments of the present invention provide novel double patterning techniques where stitching of polygonal-shaped portions of conductive lines is achieved by stitching bridges formed in an adjacent material layer. Thus, re-introduction of a minimum pitch or gap in the double patterning process is avoided.

The present invention will be described with respect to embodiments in a specific context, namely in the patterning of conductive lines. The invention may also be applied, however, to the patterning of other features of semiconductor devices, particularly features having a repeating pattern and comprising small sizes, e.g., reaching the resolution limits of the lithography system and processes used to pattern the device features. Embodiments of the invention may be implemented in many semiconductor applications such as memory devices, logic devices, mixed signal, and other applications, as examples.

Embodiments of the present invention provide methods for patterning features of a semiconductor device using a novel double patterning process. Stitching bridges are formed in an underlying or overlying layer for the material layer in which features are being patterned. Placing a stitching bridge in an adjacent material layer allows the implementation of less aggressive OPC, and thus eliminates the creation of weak lithography spots in the design due to aggressive OPC used in the cut polygonal-shaped regions. The novel stitching bridges function as local interconnects for the cut or segmented conductive lines. One advantage of embodiments of the present invention is that the minimum pitch of conductive lines is not required to be increased, and thus, the cell area can be kept to a minimum.

Figure 3:
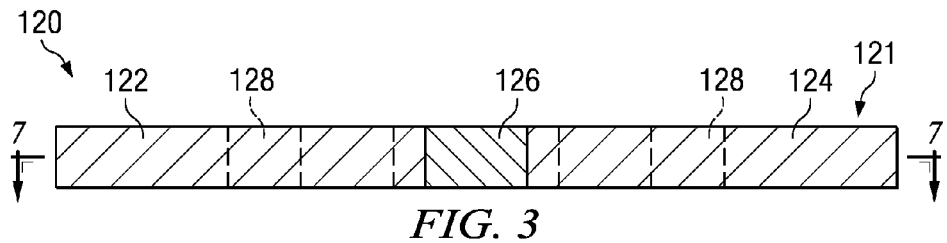
FIG. 3 illustrates a top view of novel feature of a semiconductor device in accordance with an embodiment of the present invention.
Figure 4:
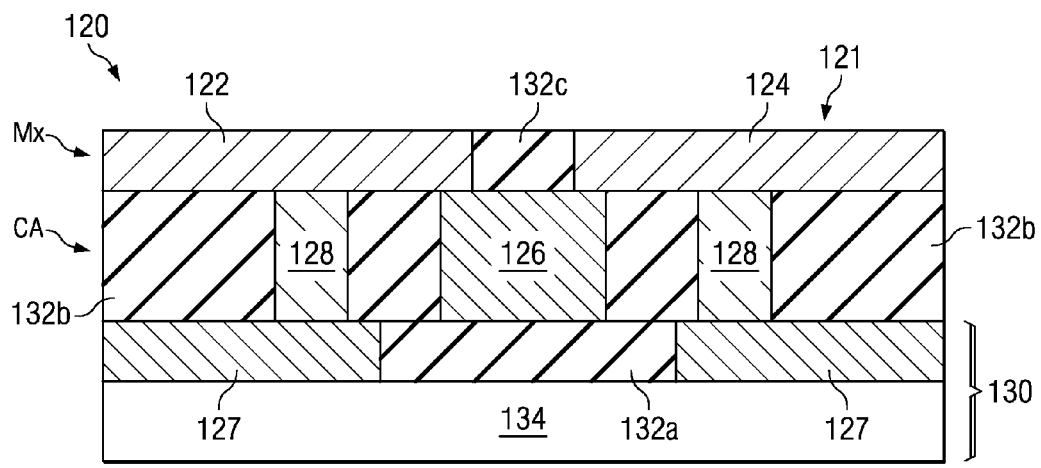
FIG. 4 shows a cross-sectional view of the feature shown in FIG. 3.

Referring next to FIG. 3, a top view of a novel feature 121 of a semiconductor device 120 in accordance with an embodiment of the present invention is shown. FIG. 4 shows a cross-sectional view of the feature 121 shown in FIG. 3. A first portion 122 of the feature 121 is formed in a first material layer Mx. A second portion 124 of the feature 121 is also formed in the first material layer Mx. The second portion 124 may be located proximate yet spaced apart from the first portion 122 of the feature 121. A third portion 126 of the feature 121 is formed in a second material layer CA that is adjacent the first material layer Mx. The third portion 126 of the feature 121 comprises a stitching bridge that couples together the first portion 122 and the second portion 124 of the feature 121.

The first material layer Mx is not necessarily deposited first; rather, in the embodiment shown in FIGS. 3 and 4, the second material layer CA is formed over a workpiece 130, and the first material layer Mx is formed over the second material layer CA. Alternatively, a first material layer Mx may be deposited first and patterned, and a second material layer Vx may be formed over the first material layer Mx, to be described further herein with reference to FIG. 5.

To manufacture the semiconductor device 120, first, a workpiece 130 is provided, as shown in FIG. 4. The workpiece 130 may include a semiconductor substrate 134 comprising silicon or other semiconductor materials covered by an insulating layer, for example. The substrate 134 may comprise a compound semiconductor such as GaAs, InP, Si/Ge, or SiC, as examples. The substrate 134 may comprise silicon oxide over single-crystal silicon, for example. The substrate 134 may comprise a silicon-on-insulator (SOI) substrate, as another example.

The workpiece 130 may include active components or circuits formed thereon. The workpiece 130 may include other conductive layers or other semiconductor elements, e.g., transistors, diodes, etc. The workpiece 130 may include one or more conductive material layers comprising conductive lines 127 that are separated by an insulating material 132a, for example, as shown. The conductive lines 127 may comprise gates of transistors in some embodiments, for example. The conductive lines 127 may comprise a metal, a semiconductive material, or combinations or multiple layers thereof, for example.

Material layers CA and Mx to be patterned are disposed over the workpiece 130. Material layer CA may comprise a contact layer of the semiconductor device 120, and material layer Mx may comprise a conductive line layer of the semiconductor device 120, as examples. In the embodiment shown in FIG. 4, second material layer CA is first formed over the workpiece 130. The second material layer CA may be formed using a damascene process or a subtractive etch process. For example, in a damascene process, a layer of insulating material 132b is formed over the workpiece 130, and the layer of insulating material 132b is patterned using a lithography process, e.g., by forming a layer of photosensitive material such as a photoresist (not shown) over the insulating material 132b, and patterning the layer of photosensitive material using a lithography mask or direct patterning method. The layer of photosensitive material is then developed. The layer of photosensitive material is then used as an etch mask to remove portions of the insulating material 132b. A conductive material is then deposited over the insulating material 132b, filling the patterns in the insulating material 132b. Excess portions of the conductive material are removed using an etch process and/or chemical mechanical polishing (CMP) process, forming the third portion 126 of the feature 121.

A plurality of contacts 128 may also be formed in the contact layer CA, as shown. The contacts 128 may optionally couple the first portion 122 of the feature 121 and the second portion 124 of the feature 121 to portions of the workpiece 130, e.g., to conductive features 127 in some embodiments, as shown. The contacts 128 may couple the first portion 122 of the feature 121 and/or the second portion 124 of the feature 121 to an active area of the workpiece 130. The active area may comprise a gate contact, a source, or a drain of a transistor in some embodiments, for example, not shown.

The plurality of contacts 128 may be formed simultaneously with the formation of the third portion 126 of the feature 121, using the same lithography process, for example. Alternatively, the plurality of contacts 128 may be formed using a separate lithography mask or process, as another example.

Alternatively, in a subtractive etch process, a layer of conductive material is deposited over the workpiece 130, and the layer of conductive material is patterned using a lithography process, forming the contacts 128 and the third portion 126 of the feature 121. The insulating material 132b is then deposited over the patterned conductive material, and any excess insulating material 132b is removed from over the third portion 126 of the feature 121 and the contacts 128.

The first material layer Mx is then formed over the second material layer CA. The first material layer Mx is formed directly adjacent, e.g., abutting the second material layer CA. The first material layer Mx is then patterned using two lithography processes, e.g., using a double patterning technique. A design for a plurality of features 121 comprising conductive lines may be provided, and a coloring technique may be applied to determine which of two lithography masks or processes the first portion 122 and second portion 124 will be patterned with, for example. The first portion 122 of the feature 121 is then formed using a first lithography mask or process, and the second portion 124 of the feature 121 is formed using a second lithography mask or process, the second lithography mask or process being different than the first lithography mask or process.

The first material layer Mx may be patterned using a damascene process or a subtractive etch process, as previously described herein for the second material layer CA. A layer of photosensitive material and optionally also a hard mask (not shown) may be formed over the conductive material of the first portion 122 and the second portion 124 of the feature 121, e.g., in a subtractive etch process, or over the insulating material 132c, in a damascene process. The layer of photosensitive material (and optionally also the hard mask) is first patterned using the first lithography mask and process, and the layer of photosensitive material is patterned a second time using the second lithography mask and process. After the two lithography steps, the layer of photosensitive material and/or hard mask is then used as an etch mask to pattern the conductive material (in a subtractive process) or the insulating material (in a damascene process), forming the first portion 122 and the second portion 124 of the feature 121. The first portion 122 and the second portion 124 of the feature 121 do not intersect or may barely intersect within the first material layer Mx. The design intent may be for the first portion 122 and the second portion 124 of the feature 121 to intersect in some embodiments; however, the first portion 122 and the second portion 124 may not intersect due to process variability or ineffective optical proximity correction, for example.

In some embodiments, a hard mask (not shown) may be formed over material layer Mx, and two layers of photosensitive material may be used to pattern the hard mask. The patterns from two different lithography masks or processes are formed in the hard mask. The layers of photosensitive material are removed after each patterning process for the hard mask. The hard mask may then be used as an etch mask to pattern the material layer Mx.

Insulating material layers 132a, 132b, and 132c of the semiconductor device 120 may comprise silicon dioxide, silicon nitride, a low dielectric constant (k) material having a k value less than about 3.9, or combinations and multiple layers thereof, as examples. Alternatively, insulating material layers 132a, 132b, and 132c may comprise other materials. The first portion 122, the second portion 124, and the third portion 126 of the feature 121 may comprise a metal, a semiconductive material, or a combination or multiple layers thereof. The first portion, second portion 124, and third portion 126 of the feature 121 may include one or more liners and may comprise metals such as copper or aluminum, or may comprise polysilicon or amorphous silicon that may optionally be silicided, as additional examples. Alternatively, the first portion 122, the second portion 124, and the third portion 126 of the feature 121 may comprise other materials.

The third portion 126 of the feature 121 couples the first portion 122 to the second portion 124 of the feature 121. Thus, the third portion 126 of the feature 121 comprises a stitching bridge in an adjacent material layer CA that electrically connects together the first portion 122 and the second portion 124 of the feature 121 that are not connected or may be barely connected together during the double patterning process flow. The third portion 126 may be substantially the same size as other contacts 128 formed in the material layer CA, or the third portion 126 may be larger than contacts 128 as shown in FIG. 4, for example.

The third portion 126 of the feature 121 has a first end and a second end opposite the first end. The first end of the third portion 126 is coupled to the first portion 122 of the feature 121, and the second end of the third portion 126 is coupled to the second portion 124 of the feature 121. The first portion 122, second portion 124, and third portion 126 together comprise a single feature 121 comprising a conductive line, in some embodiments.

In the embodiment shown in FIG. 4, the third portion 126 of the feature 121 comprising the stitching bridge is formed in a material layer CA disposed beneath the material layer Mx that the first portion 122 and the second portion 124 are formed in. Alternatively, the third portion 126 of the feature 121 that connects the first portion 122 to the second portion 124 of the feature 121 may be disposed in a second material layer Vx disposed over the first material layer Mx, as shown in FIG. 5, which shows a cross-sectional view of a feature 121 in accordance with another embodiment of the present invention.

The third portion 126 is formed in a second material layer comprising a via layer Vx of the semiconductor device 120 in this embodiment. A plurality of vias 140 and 142 may also be formed in the via layer Vx, for example, formed simultaneously with the formation of the third portion 126 or using a separate lithography process or mask. The vias 140 and 142 and the third portion 126 of the feature 121 may be formed within an insulating material 132d using a damascene process or a subtractive etch process, as described for material layers CA and Mx, for example. The third portion 126 may be substantially the same size or larger than vias 140 and 142 formed in the via layer Vx, for example. The vias 140 and 142 may couple the first portion 122 and the second portion 124 to conductive lines (not shown) of the semiconductor device 120 that are formed in a subsequent manufacturing process step, e.g., by coupling conductive lines to the tops of the vias 140 and 142.

Figure 5:
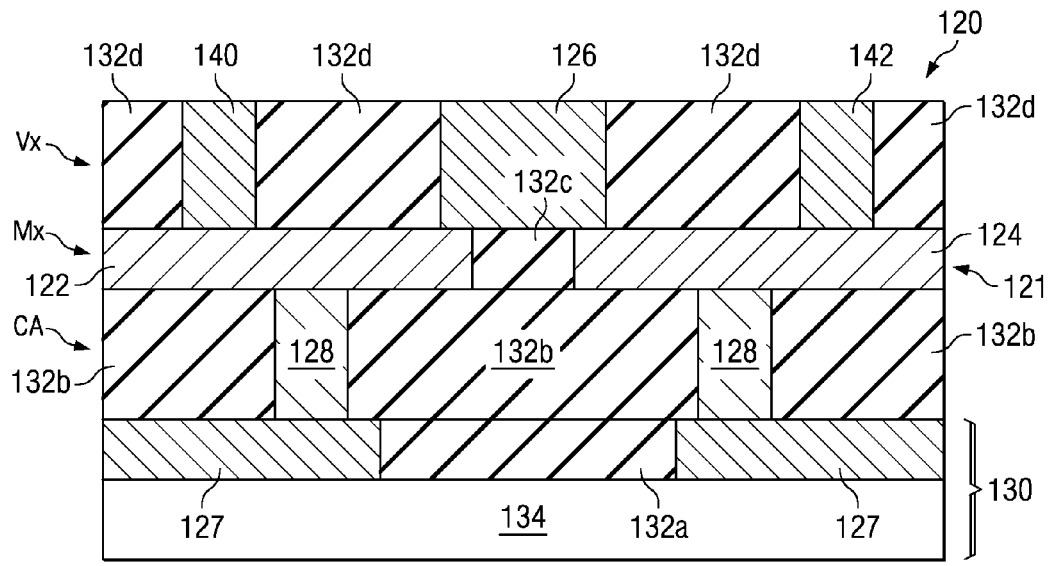
FIG. 5 shows a cross-sectional view of a feature in accordance with another embodiment of the present invention.
Figure 6:
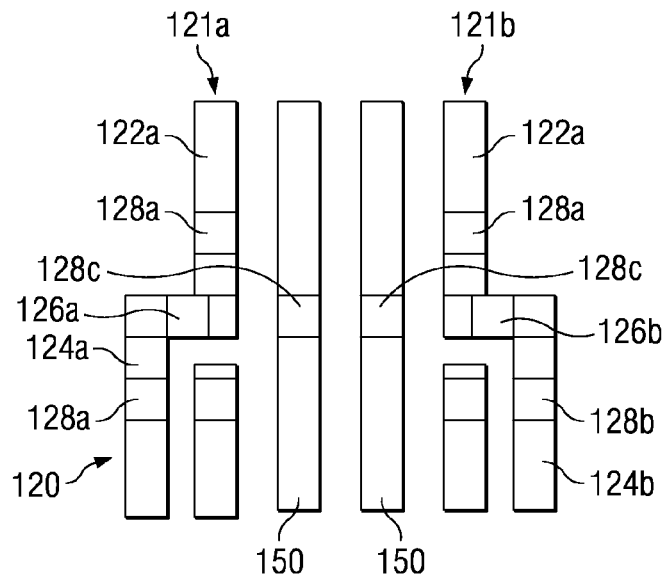
FIG. 6 shows a top view of a plurality of features of a semiconductor device in accordance with an embodiment of the present invention.

Only one feature 121 comprising a first portion 122, a second portion 124, and a third portion 126 is shown in FIGS. 3 through 5; however, in accordance with some embodiments of the present invention, a plurality of features 121 comprising a first portion 122, a second portion 124, and a third portion 126 may be formed on a semiconductor device 120. For example, FIG. 6 shows a top view of a plurality of features 121a, 121b, and 150 of a semiconductor device 120 in accordance with an embodiment of the present invention. Some features 150 may not include third portions 126 comprising stitching bridges, for example. Other features 121a may include a first portion 122a, a second portion 124a, and a third portion 126a coupling together the first portion 122a and the second portion 124a. Other features 121b may include a first portion 122b, a second portion 124b, and a third portion 126b. Contacts 128a, 128b, and 128c may also be included that are coupled to the features 121a, 121b, and 150, as shown.

Figure 7:
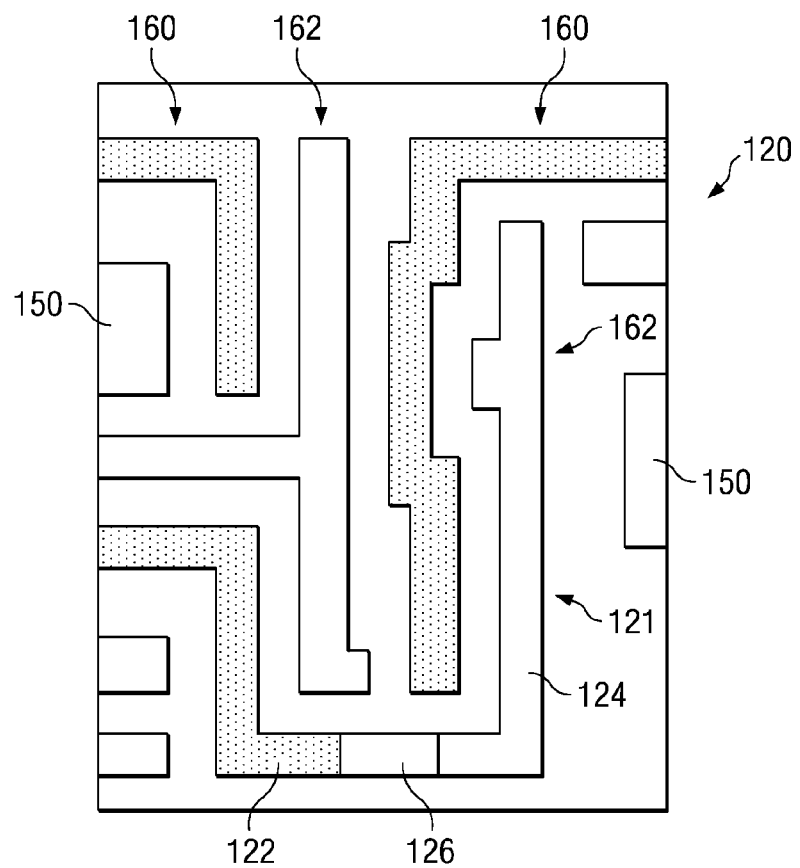
FIG. 7 shows a top view of a plurality of features of a semiconductor device in accordance with another embodiment of the present invention.

FIG. 7 shows a top view of a plurality of features 121 and 150 of a semiconductor device 120 in accordance with another embodiment of the present invention. In general, alternating features 150 or first portions 122 and second portions 124 of features 121 are patterned using two separate lithography processes or masks, e.g., as shown at 160 and 162. Numbers 160 and 162 indicate which of two masks the polygon shapes will be assigned to after the design split for a minimum pitch, for example. A third portion 126 comprising a stitching bridge in an adjacent material layer is used to couple together the first portion 122 and second portion 124 of features 121 where a split of the features 121 is required for the double patterning process.

Figure 8:
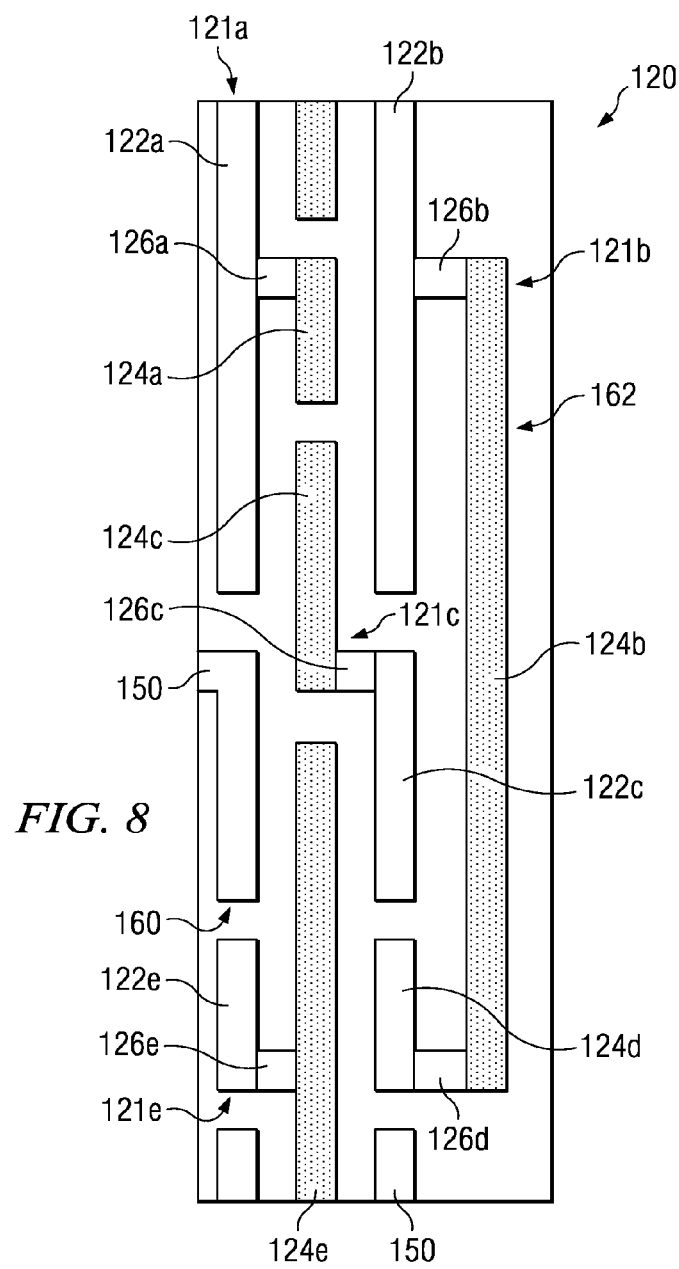
FIG. 8 shows a top view of a plurality of features of a semiconductor device in accordance with yet another embodiment of the present invention.

FIG. 8 shows a top view of a plurality of features 121a, 121b, 121c, and 121e of a semiconductor device 120 in accordance with yet another embodiment of the present invention. Again, some features 150 do not require third portions 126 comprising stitching bridges formed in an adjacent material layer, but other features 121a, 121b, 121c, and 121e include the third portions 126a, 126b, 126c, and 126e. A feature 121b may include two or more third portions 126b and 126d and two or more second portions 124b and 124d, as shown. Thus, some features such as feature 121b may include a plurality of third portions 126b and 126d along the length thereof that couple the portions 122b, 124b, and 124d of the feature 121b together that were patterned using different lithography masks or processes.

Lithographically weak locations of a double patterning design may be determined using simulation, and third portions 126, 126a, 126b, 126c, 126d, and 126e comprising stitching bridges may be placed in the weak locations in the layout of the underlying or overlying material layer, in accordance with some embodiments of the present invention. In some designs, there may not be space or room in an underlying material layer such as layer CA in FIG. 5 for the stitching bridges comprising the third portions 126, 126a, 126b, 126c, 126d, and 126e; in such designs, an overlying layer such as layer Vx may be used. In other embodiments, some portions of features of the accepting layer (such as layers CA or Vx) may be displaced or rerouted, in order to accommodate the third portions 126, 126a, 126b, 126c, 126d, and 126e comprising the stitching bridges and to avoid shorts to underlying structures. If dummy gates or other features are formed in an underlying layer, e.g., layer CA of FIG. 5, the third portions 126, 126a, 126b, 126c, 126d, and 126e may be coupled to such dummy structures without negatively impacting the semiconductor device 120 performance, for example. Alternatively, if active gates, e.g., of transistors, exist in a design where a third portion 126 is desired to be located, the active gates may be moved, or another location may be found for the third portion 126, 126a, 126b, 126c, 126d, and 126e comprising a stitching bridge, as another example. Embodiments of the present invention may be implemented in a library of a standard cell, such as in a library flip-flop design, for example.

The lithography masks used to pattern the first portions 122, second portions 124, and third portions 126 of features 121 described herein may comprise bright field binary masks, attenuating masks, dark field masks, alternating phase shift masks, or other types of masks, as examples, not shown. The patterns for the first portions 122, second portions 124, and third portions 126 of the features 121 may include small protrusions or serifs along their length or at their ends for OPC to compensate at least partially for diffraction effects in the lithography process and system, for example, not shown. Alternatively, the first portions 122, second portions 124, and third portions 126 of the features 121 described herein may be patterned using direct patterning methods, for example.

1:1 lithography systems or lithography systems that comprise a reduction factor may be used to pattern the first portions 122, second portions 124, and third portions 126 of the features 121 described herein, such as a 4:1 reduction factor, as an example, although other reduction factors may also be used. In some embodiments, one or more hard masks may be formed over the material layers before applying the layers of photosensitive material, and the hard mask and/or photosensitive material may be used to pattern the first portions 122, second portions 124, and third portions 126 of the features 121, for example. The lithography systems used to pattern the first portions 122, second portions 124, and third portions 126 of the features 121 described herein may comprise lithography systems that utilize ultraviolet (UV) or extreme UV (EUV) light, optical lithography systems, x-ray lithography systems, interference lithography systems, or immersion lithography systems, as examples.

After the embodiments of the present invention shown in FIGS. 4 and 5, further processing of the semiconductor device 120 is continued to complete the fabrication process. For example, insulating material layers may be formed over the material layers Mx or Vx, and additional conductive material layers may be formed over the semiconductor devices 120 to provide electrical connection to the features 121 and between various circuit components formed on the semiconductor devices 120, for example, not shown.

Embodiments of the present invention described herein comprise novel methods of patterning features 121 and novel methods of manufacturing semiconductor devices 120. Embodiments of the present invention also include semiconductor devices 120 patterned using the novel methods described herein, for example.

The novel lithography methods and semiconductor device 120 manufacturing methods described herein may be used to fabricate many types of semiconductor devices 120, including memory devices, logic devices, flip-flops, and ring oscillators, as examples, although other types of semiconductor devices, integrated circuits, and circuitry may be fabricated using the novel embodiments of the present invention described herein.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning a feature, the method comprising:
    forming a first portion of the feature in a first material layer;
    forming a second portion of the feature in the first material layer; and
    forming a third portion of the feature in a second material layer, wherein forming the first portion of the feature comprises using a first lithography process, wherein forming the second portion of the feature comprises using a second lithography process, the second lithography process being different than the first lithography process.

2. The method according to claim 1, wherein forming the third portion comprises forming a third portion having a first end and a second end, wherein forming the third portion comprises coupling the first end of the third portion to the first portion of the feature and coupling the second end of the third portion to the second portion of the feature.

3. The method according to claim 1, wherein forming the first portion and forming the second portion comprise forming a first portion and a second portion that do not intersect or barely intersect, wherein forming the third portion comprises coupling the first portion to the second portion.

4. The method according to claim 1, wherein forming the first portion, forming the second portion, and forming the third portion comprise forming a conductive line.

5. The method according to claim 1, wherein forming the first portion, forming the second portion, or forming the third portion comprise forming a metal, a semiconductive material, or a combination or multiple layers thereof.

6. The method according to claim 1, wherein forming the first portion, forming the second portion, or forming the third portion comprise a subtractive etch process.

7. The method according to claim 1, wherein forming the first portion, forming the second portion, or forming the third portion comprise a damascene process.

8. A method of manufacturing a semiconductor device, the method comprising:
    forming a first material layer and a second material layer over a workpiece, the second material layer being adjacent the first material layer;
    patterning a first portion of a feature in the first material layer using a first lithography mask or process;
    patterning a second portion of the feature in the first material layer using a second lithography mask or process wherein the second lithography mask or process being different than the first lithography mask or process; and
    forming a third portion of the feature in the second material layer, wherein the third portion of the feature couples the first portion of the feature to the second portion of the feature.

9. The method according to claim 8, wherein forming the first material layer and the second material layer comprises first, forming the first material layer over the workpiece, and second, forming the second material layer over the first material layer, wherein the method comprises forming the first portion of the feature and forming the second portion of the feature before forming the third portion of the feature.

10. The method according to claim 8, wherein forming the first material layer and the second material layer comprises first, forming the second material layer over the workpiece, and second, forming the first material layer over the second material layer, wherein the method comprises forming the first portion of the feature and forming the second portion of the feature after forming the third portion of the feature.

11. The method according to claim 8, wherein forming the third portion comprises forming a stitching bridge of the feature.

12. The method according to claim 8, further comprising forming at least one contact or at least one via in the second material layer.

13. The method according to claim 12, wherein forming the third portion comprises forming a third portion that is substantially the same size or larger than the at least one contact or the at least one via.

14. The method according to claim 12, wherein forming the third portion and forming the at least one contact or the at least one via comprise simultaneously forming the third portion and the at least one contact or the at least one via in the second material layer.

15. The method according to claim 12, wherein forming the at least one contact or the at least one via comprises coupling the first portion or the second portion of the feature to an active area of the workpiece or to conductive lines of the semiconductor device.

16. The method according to claim 15, wherein coupling the first portion or the second portion of the feature to the active area of the workpiece comprises coupling the first portion or the second portion of the feature to a gate contact, a source, or a drain of a transistor.

* * * * *